United States Patent [19]

Gijs et al.

[11] Patent Number: 5,636,093

[45] Date of Patent: Jun. 3, 1997

[54] MAGNETIC MULTILAYER DEVICE HAVING RESONANT-TUNNELING DOUBLE-BARRIER STRUCTURE

[75] Inventors: Martinus A. M. Gijs; Hendrik Van Houten, both of Eindhoven, Netherlands

[73] Assignee: U.S. Philips Corporation, New York, N.Y.

[21] Appl. No.: 535,703

[22] Filed: Sep. 28, 1995

[30] Foreign Application Priority Data

Oct. 5, 1994 [EP] European Pat. Off. .............. 94202882

[51] Int. Cl.⁶ .............................. G11B 5/147; H01L 27/14
[52] U.S. Cl. .............................. 360/126; 360/113; 257/25
[58] Field of Search ................................ 360/113, 125, 360/126, 110, 111, 115; 257/14, 25; 338/32 R; 324/207.21, 252

[56] References Cited

U.S. PATENT DOCUMENTS

| | | | |
|---|---|---|---|
| 5,350,931 | 9/1994 | Harvey et al. | 257/14 |
| 5,390,061 | 2/1995 | Nakatani et al. | 360/113 |
| 5,399,879 | 3/1995 | Liu | 257/14 |
| 5,449,561 | 9/1995 | Golding et al. | 428/457 |
| 5,452,163 | 9/1995 | Coffey et al. | 360/113 |
| 5,474,833 | 12/1995 | Etienne et al. | 360/113 |
| 5,493,465 | 2/1996 | Kamiguchi et al. | 360/113 |
| 5,508,867 | 4/1996 | Cain et al. | 360/113 |
| 5,527,626 | 6/1996 | Gijs et al. | 360/113 |
| 5,565,695 | 10/1996 | Johnson et al. | 360/113 |

OTHER PUBLICATIONS

Physical Review B, vol. 39, No. 10, Apr. 1989, J.C. Slonczewski, "conductance and exchange coupling of two ferromagnetic separated by a tunneling barrier", pp. 6995–7002.

Appl. Phys. Lett., vol. 63, No. 14, Oct. 1993, J.R. Childress et al., "new epitaxial multiplayer system for spin–value magnetic sensors" pp. 1996–1998.

Meiklejohn and Bean in Phys. Rev. 102 #5 (1956), pp. 1413–1414. Jun. 1956.

Phys. Rev. 105 (1957), pp. 904–913. vol. 105, #3 Meiklejohn and Bean Feb. 1957.

"Oscillations in Exchange Coupling and Magnetoresistance in Metallic Superlattice Structures: Co/Ru, Co/Cr, and Fe/Cr", by S.S.P. Parkin et al, Physical Review Letters, vol. 64, No. 19, May. 7, 1990, pp. 2304–2307.

"Tunneling in a Finite Superlattice", by R. Tsu, Appl. Phys. Lett., vol. 22, No. 11, Jun. 1, 1973, pp. 562–564.

"Resonant Tunneling in Semiconductor Double Barriers", by L.L. Chang et al, Appl. Phys. Lett., vol. 24, No. 12, Jun. 15, 1974, pp. 593–595.

J.E. Ortega et al., Phys, Rev. B 47 (1993), pp. 1540–1552 vol. 47, #3 Jan. 1993.

P. Bruno, Phys. Rev. B 49 (1994), pp. 134231–13234 vol. 49, #18 May 1994.

*Primary Examiner*—Jefferson Evans
*Attorney, Agent, or Firm*—John C. Fox

[57] ABSTRACT

A magnetic multilayer device (1) comprising two layers (3, 5) of magnetic material which are separated by an interposed layered structure comprising a resonant-tunneling double-barrier structure (RTDBS) (7). In such a device (1), exchange coupling between the magnetic layers (3, 5) can be modified by subjection of the RTDBS (7) to an electric field. In this way, the configuration of the magnetisations ($M_1$, $M_2$) in the magnetic layers (3, 5), and thus the net magnetic flux generated by the device (1), can be electrically adjusted. The device (1) can be applied inter alia in a magnetic recording head.

8 Claims, 2 Drawing Sheets

MAGNETIC MULTILAYER DEVICE HAVING RESONANT-TUNNELING DOUBLE-BARRIER STRUCTURE

BACKGROUND OF THE INVENTION

The invention relates to a magnetic multilayer device comprising two layers of magnetic material which are separated by an interposed layered structure.

The invention further relates to the application of such a device in a magnetic recording head.

Multilayer devices as described in the opening paragraph are well known in the art, and are elucidated inter alia in the article by Parkin et al. in Phys. Rev. Lett. 64 (1990), pp 2304–2307, which is devoted to Co/Ru, Co/Cr and Fe/Cr superlattices. Multilayers such as these comprise alternately stacked layers of ferromagnetic material (Co or Fe) and non-magnetic material (Ru or Cr), and are particularly suitable for application in magneto-resistive field sensors, such as magnetic read heads. The so-called spin-valve magneto-resistance effect on which such sensors are based relies on the fact that the measured electrical resistance of the multilayer structure is determined by the mutual magnetisation configuration in the ferromagnetic layers, said resistance being (generally) higher for an anti-parallel configuration than for a parallel configuration. In the known structures, this configuration can only be controllably adjusted by suitable application of an external magnetic field, as elucidated for example in U.S. Pat. No. 5,134,533.

The above-cited article particularly describes how the exchange-coupling between consecutive ferromagnetic layers in the known structures is dependent on the thickness of the interposed non-magnetic layers. For example, it is revealed that such coupling can be either ferromagnetic (F) or antiferromagnetic (AF), depending on the exact interlayer thickness. This is an interesting phenomenon, since F coupling will produce a mutually parallel magnetisation configuration in consecutive ferromagnetic layers, whereas AF coupling will cause a mutually anti-parallel magnetisation configuration. These different magnetisation configurations will in turn correspond to substantially different magnetic flux distributions for the sample. Unfortunately, however, interlayer thickness is not a parameter which can be varied subsequent to the multilayer structure's manufacture, so that such controllable adjustments of the exchange coupling are not practically attainable in a finished structure of the known type.

OBJECTS AND SUMMARY OF THE INVENTION

It is an object of the invention to provide a magnetic multilayer structure in which the magnetisation configuration of consecutive magnetic layers can be altered by means other than the application of an external magnetic field. It is a further object of the invention that exchange coupling between consecutive magnetic layers in the finished multilayer structure should be adjustable. In particular, the invention aims to enable such adjustment by means of the application of a suitable electric field.

These and other objects are achieved in a device as specified in the opening paragraph, characterised in that the interposed layered structure comprises a resonant-tunneling double-barrier structure (RTDBS).

The fundamental properties of resonant-tunneling double-barrier structures are elucidated in articles by Tsu and Esaki in Appl. Phys. Lett. 22 (1973), pp 562–564, and by Chang et al. in Appl. Phys. Lett. 24 (1974), pp 593–595. In essence, such a structure consists of a layer of host semi-conductor material (the so-called intermediate layer) which is symmetrically sandwiched between two so-called barrier layers. The material of these barrier layers is a slight modification of that of the intermediate layer, generally as a result of addition of one or more foreign substances. In an exemplary RTDBS, the intermediate layer consists of GaAs and the barrier layers both consist of $Al_{1-x}Ga_xAs$, where x can be chosen to lie in the range 0.4–0.8. The collective electronic band structure of such a trilayer contains a discrete spectrum of so-called resonant energy levels $E_n$, whose exact positions are determined by the precise composition and thickness of the individual layers in the structure.

The tunneling transmission coefficient $T_i$ of the RTDBS for incoming electrons depends sharply on the component $E_i$ of the electron energy corresponding to the electron motion perpendicular to the RTDBS. In particular, if $E_i=E_n$, then $T_i$ has a value of 1, and incoming electrons can successfully tunnel through the structure. However, when $E_i$ has a value which does not coincide with one of the resonant energy levels $E_n$, then $T_i$ drops sharply towards zero, and significant tunneling no longer occurs. By applying an electric field across the RTDBS, the value of $E_i$ relative to the spectrum $E_n$ is changed, so that the tunneling behaviour of electrons through the structure is accordingly modified.

Exchange coupling between magnetic layers is mediated by the spin-conserved exchange of electrons between those layers. In particular, the nature and strength of the coupling are determined by the manner in which the wave functions of the magnetic layers overlap one another, as further elucidated in the following exemplary publications:

P. Bruno, J. Magn. Magn. Mater. 121 (1993), pp 248–252;

J. E. Ortega et at., Phys. Rev. B 47 (1993), pp 1540–1552;

P. Bruno, Phys. Rev. B 49 (1994), pp 13231–13234.

By arranging the magnetic layers on either side of an RTDBS, in accordance with the invention, the electron-exchange between the magnetic layers can be modified by subjection of the RTDBS to an electric field (as hereabove elucidated). The presence of such an electric field can significantly alter the overlap of the magnetic layer wave functions, thereby fundamentally influencing the nature and strength of the exchange coupling between the magnetic layers. For example, the said electric field may be used to reversibly switch the nature of the exchange coupling between AF and F states.

The required electric field can be provided, for example, by connecting the two magnetic layers of the inventive device to opposite poles of a variable voltage source. In general, the voltage-difference between the magnetic layers in such a case need only be of the order of about 10 V (at most), in order to secure satisfactory enaction of the invention.

The inventive device may, of course, also be based on a resonant-tunneling multiple-barrier structure (RTMBS), which is a generalisation of the basic RTDBS and comprises additional intermediate-layer/barrier-layer units in series with the trilayer structure of the RTDBS. Use of such an RTMBS between magnetic layers is interpreted as falling within the scope of the present invention, since the RTMBS always comprises at least one RTDBS. For the sake of clarity, the further discussion herebelow will only make explicit reference to the use of an RTDBS.

The $Al_{1-x}Ga_xAs/GaAs/Al_{1-x}Ga_xAs$ RTDBS referred to hereabove is particularly suitable for use in the inventive device. This is inter alia because of the fact that Al and Ga have similar chemical bond properties, together with an almost identical ion size, so that introduction of Al into the GaAs system causes minimal disturbance of its crystal lattice. This is important, since the RTDBS in the inventive device must be capable of sustaining spin-conserved electron-exchange between neighbouring magnetic layers, which in turn requires potential scattering sites in its lattice to be kept to a minimum.

In this context, it is also desirable to achieve epitaxial growth of both the RTDBS and the magnetic layers, since this will further promote lattice continuity and impede possible scattering phenomena in the inventive multilayer device. To this end, a particularly suitable material for use in the magnetic layers is MnGa, which is ferromagnetic and has a surface net and in-plane lattice constant which are highly compatible with those of GaAs (and $Al_{1-x}Ga_xAs$). The desired epitaxial growth may be achieved using a deposition technique such as molecular beam epitaxy (MBE) or chemical vapour deposition (CVD), for example.

A preferential embodiment of the inventive device employs an RTDBS in which the intermediate layer has a thickness in the range 1–10 nm, and the barrier layers have a thickness in the range 0.5–2.0 nm. Too great a thickness of the RTDBS may excessively impede electron tunneling, whereas too small a thickness may facilitate tunneling to such an extent that the RTDBS effectively becomes an ordinary, thin insulating layer, without the characteristic properties which the invention aims to exploit. In addition, the magnitude of exchange coupling between the magnetic layers tends to decrease as their separation increases, so that too thick an RTDBS may result in a relatively low coupling strength.

The device according to the invention can be incorporated inter alia in a magnetic memory or magnetic "trimming" device. The latter device can be used to temporarily expose a magnetic body to a controllable magnetic flux, with the aim of changing ("trimming") the magnetic domain structure in the body.

A particularly attractive application of the inventive device is in a magnetic recording head (write head). In such an application, the magnetisation $M_1$ in one of the magnetic layers ($L_1$) is deliberately fixed, whereas the magnetisation $M_2$ in the other magnetic layer ($L_2$) is left free. In this way, electrical adjustment of the exchange coupling across the interposed RTDBS allows $M_2$ to be controllably redirected with respect to a fixed reference frame. For example, if the exchange coupling across the RTDBS is adjusted between an F and an AF nature, then the direction of $M_2$ can be correspondingly flipped back and forth. If now the electric field across the RTDBS is modulated in accordance with a certain (binary) data pattern, then a magnetic medium in proximity to the correspondingly modulated magnetisation $M_2$ can hereby be endowed with that data via coercive transfer. Suitable magnetic media for this purpose include magnetic tapes, discs and cards.

Since it is constructed from thin layers, and since there is no need for a coil-winding procedure, the inventive magnetic head will generally be much smaller than a conventional magnetic head.

The desired fixing of $M_1$ in the magnetic layer $L_1$ can be achieved in a number of ways, such as:

(a) Exchange-biasing the layer $L_1$. The general principles of exchange-biasing are elucidated in articles by Meiklejohn and Bean in Phys. Rev. 102 (1956), pp 1413–1414, and Phys. Rev. 105 (1957), pp 904–913;

(b) Ensuring that the magnetic anisotropy of layer $L_1$ is substantially greater than that of layer $L_2$. Such differences in anisotropy can be achieved, for example, by suitable adjustment of the exact composition of the magnetic layers, or by addition of certain foreign substances to those layers.

Both of these techniques are well known in the art.

It should be noted that the magnetisation direction in the magnetic layers of the inventive device may be either in-plane or perpendicular. Furthermore, such layers may comprise either ferromagnetic or ferrimagnetic material, and need not be of the same composition or thickness. Needless to say, the device in accordance with the invention may contain various extra layers in addition to the RTDBS and the two magnetic layers; possible candidates for such extra layers include exchange-biasing layers, insulation layers, anti-corrosion layers, magneto-resistive trilayers, etc. Moreover, the inventive device may of course be embodied in the form of a multilayer structure containing more than two magnetic layers, whereby an RTDBS (or RTMBS) is interposed between each pair of consecutive magnetic layers.

BRIEF DESCRIPTION OF THE DRAWINGS

The invention and its attendant advantages will be further elucidated with the aid of exemplary embodiments and the accompanying schematic drawings, not all of uniform scale, whereby.

DESCRIPTION OF THE PREFERRED EMBODIMENTS

Embodiment 1

Figure 1:
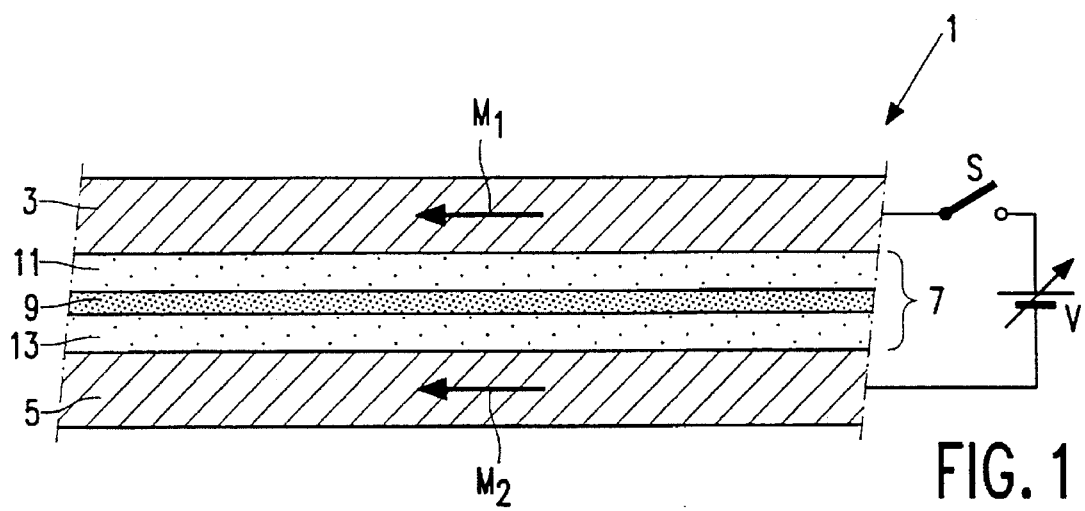
FIG. 1 renders a cross-sectional view of part of an exemplary magnetic multilayer device in accordance with the invention.
Figure 2:
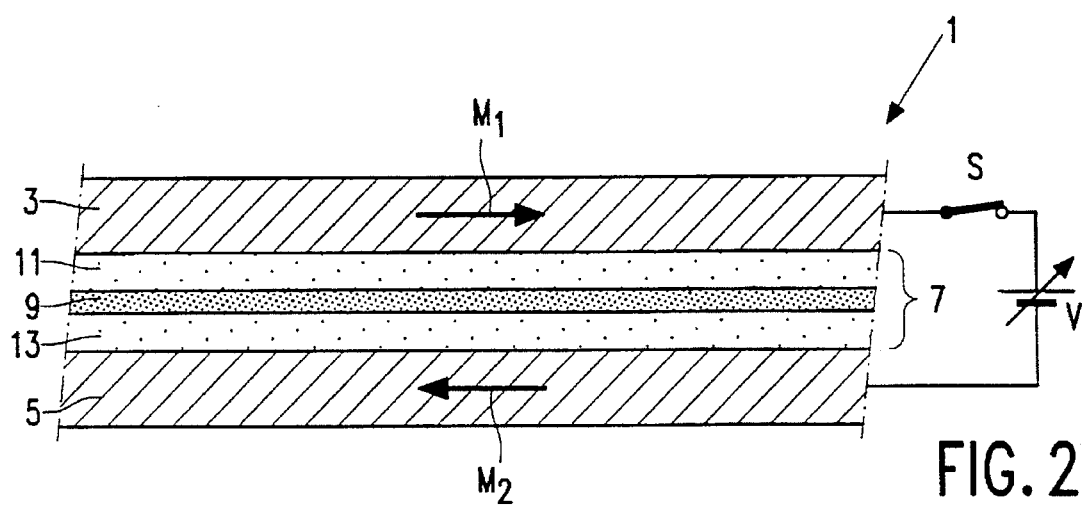
FIG. 2 depicts the subject of FIG. 1, during subjection of its constituent RTDBS to an electric field.

FIGS. 1 and 2 schematically depict the basic structure and operating principle of a device in accordance with the present invention. Corresponding items in both Figures are denoted by the same reference labels.

FIG. 1 renders a cross-sectional view of part of the inventive device 1, which comprises two layers 3, 5 of magnetic material, and an interposed RTDBS 7. The RTDBS 7 is itself a layered structure, comprising an intermediate layer 9 of host semiconductor material which is sandwiched between two barrier layers 11, 13 of modified semiconductor material. The magnetic layers 3, 5 are connected to opposite poles of a variable voltage source V, S, by means of which an electric field can be applied across the RTDBS 7.

Specific materials suitable for employment in the device 1 are, for example, MnGa in the layers 3, 5, GaAs in the layer 9, and $Al_{0.5}Ga_{0.5}As$ in the layers 11, 13.

The magnetic layers 3, 5 are exchange-coupled across the interposed RTDBS 7. As here depicted, the nature of this exchange coupling is F, so that the magnetisation $M_1$ in layer 3 and the magnetisation $M_2$ in layer 5 are in parallel configuration.

In FIG. 2, the variable voltage source V, S has been invoked to subject the RTDBS 7 to a controllable electric field. As a result hereof, the incident energy of conduction electrons passing between the magnetic layers 3 and 5 is shifted with respect to the resonant energy spectrum of the RTDBS 7. In addition, the overlap of the wave functions of the magnetic layers 3, 5 is modified. Consequently, the nature of the exchange coupling between layers 3 and 5 will change, in a manner depending on the strength of the applied electric field. In particular, correct adjustment of this electric field can cause the intrinsic F coupling between the layers 3 and 5 to be replaced by induced AF coupling (with an attendant anti-parallel configuration of the magnetisations $M_1$ and $M_2$). Later removal of the applied electric field allows reversion to the initial F coupling across the RTDBS 7.

Embodiment 2

Figure 3:
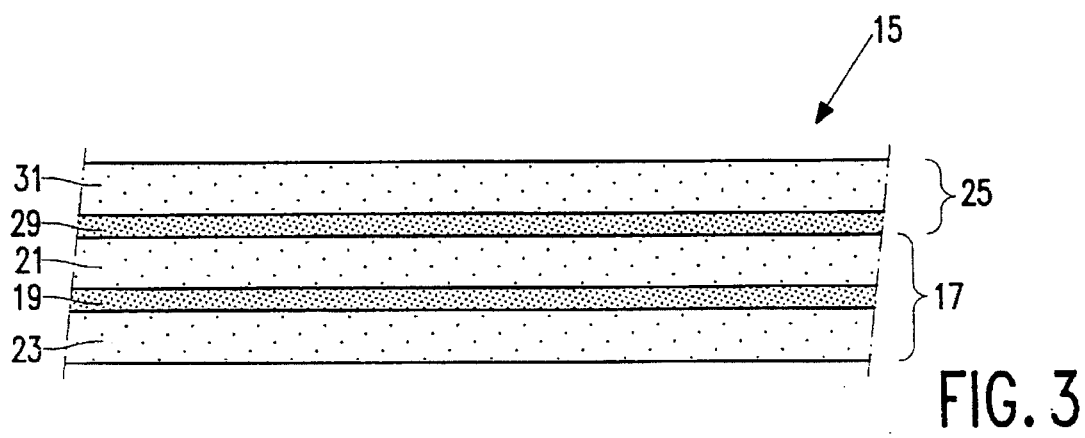
FIG. 3 shows a partial cross-section of an exemplary RTMBS suitable for application in the inventive device.

FIG. 3 renders a cross-sectional view of part of a particular resonant-tunneling multiple-barrier structure (RTMBS) 15 which, in accordance with the invention, can be substituted for the basic RTDBS 7 in FIG. 1 to produce a device with essentially the same inventive characteristics. The RTMBS 15 effectively comprises a basic RTDBS 17 in series with a supplementary block 25 comprising both an intermediate layer 29 and a barrier layer 31. All three barrier layers 31, 21, 23 are preferably of the same thickness and composition, as are the two intermediate layers 29, 19.

If so desired, the structure 15 can be further extended by addition of still more blocks 25, so as to form a 7-layer or 9-layer RTMBS, for example.

Embodiment 3

Figure 4:
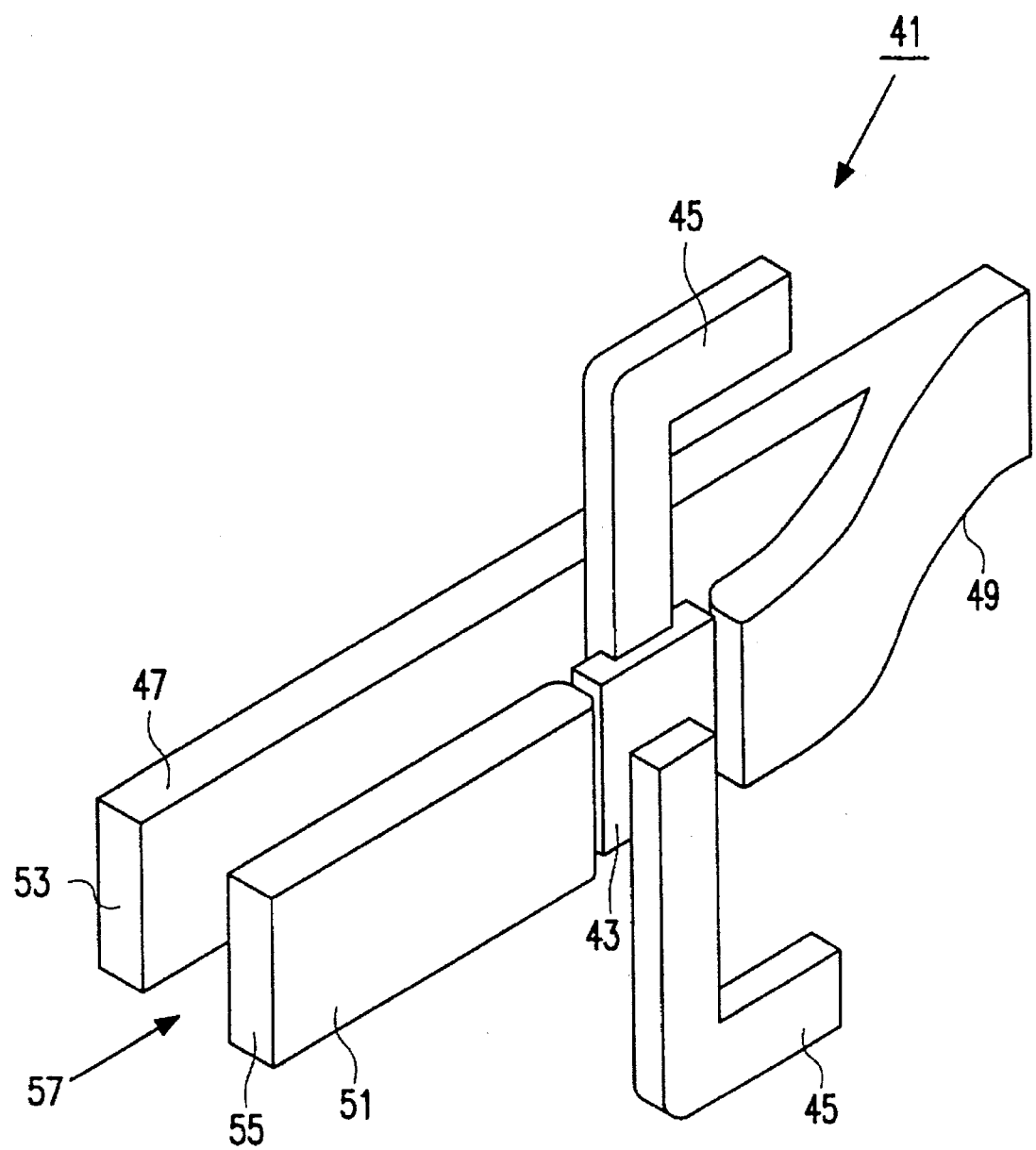
FIG. 4 gives a perspective view of a magnetic head in which the inventive device has been incorporated.

FIG. 4 is a schematic perspective view of part of a magnetic recording head (write head) 41 comprising an inventive magnetic multilayer device 43 (such as that depicted in FIG. 1) with electrical connections 45. The head 41 further comprises flux guides 47, 49, 51, which are positioned relative to the device 43 so as to form a magnetic circuit therewith. The end faces 53, 55 form part of the pole face of the magnetic head 41, the magnetic gap 57 being located between said faces 53, 55.

In accordance with the invention, the magnetic flux generated by the device 43 can be modulated by suitable application of an electrical potential difference across the electrical connectors 45 (thereby altering the magnetisation configuration in the device 43). Such flux modulations are carried by the flux guides 47, 49, 51 to the gap 57, where they create an intense modulated magnetic field between the pole faces 53, 55. A suitable magnetic medium (such as a tape, disc or card) passing in close proximity to the pole faces 53, 55 will be subjected to this varying field, causing permanent alteration of its magnetic domain structure. In this way, data corresponding to the electrical potential modulations can be recorded on the magnetic medium.

We claim:

1. A magnetic multilayer device comprising two adjustably exchange coupled layers of magnetic material which are separated by an interposed layered structure, characterised in that the interposed layered structure comprises a resonant-tunneling double-barrier structure (RTDBS) having an intermediate layer sandwiched between two barrier layers.

2. A device according to claim 1, characterised in that the intermediate layer of the RTDBS comprises GaAs, and the barrier layers of the RTDBS each comprise $Al_{1-x}Ga_xAs$ wherein x=0.4–0.8.

3. A device according to claim 2, characterised in that the magnetic material comprises MnGa.

4. A device according to claim 2, characterised in that the intermediate layer of the RTDBS has a thickness in the range 1–10 nm, and that the barrier layers of the RTDBS each have a thickness in the range 0.5–2.0 nm.

5. A device according to claim 1, characterised in that the magnetic material comprises MnGa.

6. A device according to claim 5, characterised in that the intermediate layer of the RTDBS has a thickness in the range 1–10 nm, and that the barrier layers of the RTDBS each have a thickness in the range 0.5–2.0 nm.

7. A device according to claim 1, characterised in that the intermediate layer of the RTDBS has a thickness in the range 1–10 nm, and that the barrier layers of the RTDBS each have a thickness in the range 0.5–2.0 nm.

8. A magnetic recording head comprising a device according to claim 1.

* * * * *